United States Patent
DeBoalt

(10) Patent No.: US 6,265,794 B1
(45) Date of Patent: Jul. 24, 2001

(54) METHOD FOR TUNING THE RESONANT FREQUENCY OF CROSSED-FLEXURE PIVOT GALVANOMETERS

(75) Inventor: Robert A. DeBoalt, Hudson, MA (US)

(73) Assignee: GSI Lumenics, Inc., Billerica, MA (US)

( * ) Notice: Subject to any disclaimer, the term of this patent is extended or adjusted under 35 U.S.C. 154(b) by 0 days.

(21) Appl. No.: 09/431,554

(22) Filed: Oct. 29, 1999

(51) Int. Cl.[7] .................................................. H02K 33/00
(52) U.S. Cl. .............................. 310/36; 310/37; 310/38; 310/39
(58) Field of Search .................................. 310/36, 37, 38, 310/39, 191, 29, 28; 417/415, 416

(56) References Cited

U.S. PATENT DOCUMENTS

| 4,187,452 | * | 2/1980 | Knappe et al. | 318/128 |
| 4,700,090 | * | 10/1987 | Bianchi et al. | 310/36 |
| 5,959,757 | | 9/1999 | Plesko | 359/198 |

FOREIGN PATENT DOCUMENTS 0 523 413 A2  6/1992  (EP) .

* cited by examiner

Primary Examiner—Elvin Enad
Assistant Examiner—Thanh Lam
(74) Attorney, Agent, or Firm—Cesari & McKenna, LLP

(57) ABSTRACT

A stator is adjustably attached to the frame of a crossed-flexure pivot galvanometer. The stator acts on a permanent-magnetic rotor, having radially facing poles, causing the rotor to torsionally oscillate, which causes the rotor to be displaced from an axis of rotation along a line of displacement. The resonant frequency of the galvanometer is controlled by adjusting the centering of the stator along a line between the radially facing poles of the permanent-magnetic rotor. With this adjustment, as the stator is brought closer to the magnet along the line between the radially facing poles, the frequency-lowering effect is maximized. As the stator is move away from the magnet along the line of displacement, the frequency-lowering effect is minimized.

5 Claims, 3 Drawing Sheets

METHOD FOR TUNING THE RESONANT FREQUENCY OF CROSSED-FLEXURE PIVOT GALVANOMETERS

BACKGROUND OF THE INVENTION

1. Field of the Invention

The present invention relates to crossed-flexure pivot galvanometers, and more particularly to the precise tuning of the resonant frequency thereof.

2. Description of the Related Art

Crossed-flexure pivot galvanometers are often used in applications such as laser printers. These galvanometers typically comprise a torsional resonant rotor attached to a stationary frame by a series of flexures, with a mirror or other load attached to the rotor for oscillation therewith. The flexures are usually comprised of pairs of springs along an axis of rotation. Each of a pair of these springs is mounted at an angle to its mate so that they cross at the axis of rotation, making an "X" shape as viewed along this axis. One end of each spring is attached on a distal side of the rotor, and the remaining ends are attached to the stationary frame of the galvanometer.

Crossed-flexure pivot galvanometers are generally used in fixed-frequency application. Specifically, the effective spring constant of the flexures and the moments of inertia of the rotor and flexure masses, as well as that of any load attached to the rotor operator to set this frequency combines to provide a torsional resonance at a desired frequency.

Since the physical attributes of the galvanometer flexures, such as their dimensions and the Young's modulus of the material from which they are made, always vary over a small range from unit to unit, and since the dimensions, stiffness, and density of the rotor materials similarly vary from to unit, it has been necessary in the former art to provide such galvanometers with a compensatory means for adjusting the resonant frequency of each unit during or after manufacture.

Traditional techniques of adjusting the resonant frequency after manufacture have been the:

(1) addition of a weight or weights, the galvanometer having been designed with an intentionally low moment of inertia; (2) removal of selected material from the rotor assembly, the galvanometer having been designed with an intentionally high moment of inertia; or (3) the variation of the effective radius of an inertial mass or masses to changed their moments of inertia.

One potential disadvantage to the above-described methods of adjusting the resonant frequency is that additional parts are needed either before or after manufacture. Another disadvantage is that small incremental adjustments require additional effort and may require several incremental masses to be added, removed or moved to arrive at the desired resonant frequency of the galvanometer. This adds additional cost and effort to the manufacture and or calibration of these devices.

It is therefore an object of the present invention to provide a method of precisely tuning the resonant frequency of a crossed-flexure pivot galvanometer, which compensates for manufacturing variability and, which employs the existing components of the pivot galvanometer without requiring the addition or removal of mass from the galvanometer.

Other objects will, in part, be obvious and will, in part, appear hereinafter. The invention accordingly comprises an article of manufacture processing the features an properties exemplified in the constructions described herein and the several steps and the relation of one or more of such steps with respect to the others and the apparatus embodying the features of construction, combination of the elements and the arrangement of parts, which are adapted to effect such steps, all as exemplified in the following detailed description, and the scope of the invention will be indicated in the claims.

DESCRIPTION OF THE INVENTION

BRIEF SUMMARY OF THE INVENTION

In accordance with the present invention I have provided a method which uses adjustment of parts of the galvanometer already present and essential, to wit the permanent-magnetic armature of the rotor and the poles of the stator, to adjust a magnetic spring which works in cooperation with the flexure springs to vary the effective overall spring constant of the device.

More specifically, the invention makes use of the fact that with a flexured rotor support, the axis of the rotor undergoes a displacement relative to the stator axis. The magnetic structure urges the rotor in the direction of maximum displacement and then acts as a torsional spring. Adjusting the stator axis relative to the rotor axis can vary this torsional spring force.

In a preferred embodiment, the present invention provides an adjustment of the stator axis with respect to the rotor along the line passing through the poles of the armature.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF AN ILLUSTRATIVE EMBODIMENT

Figure 1:
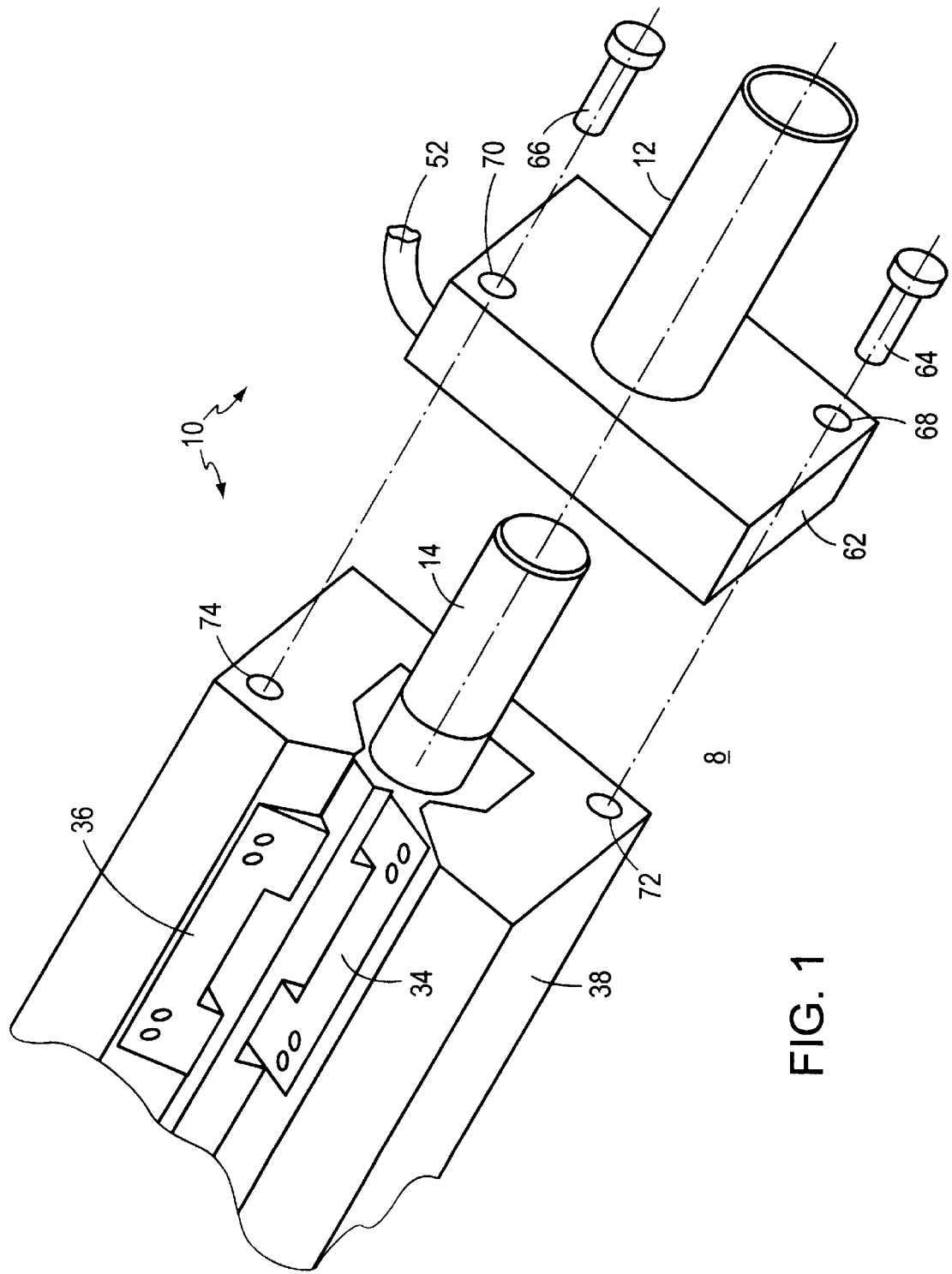
FIG. 1 is an isometric exploded view of a crossed-flexure pivot galvanometer of the present invention.
Figure 2:
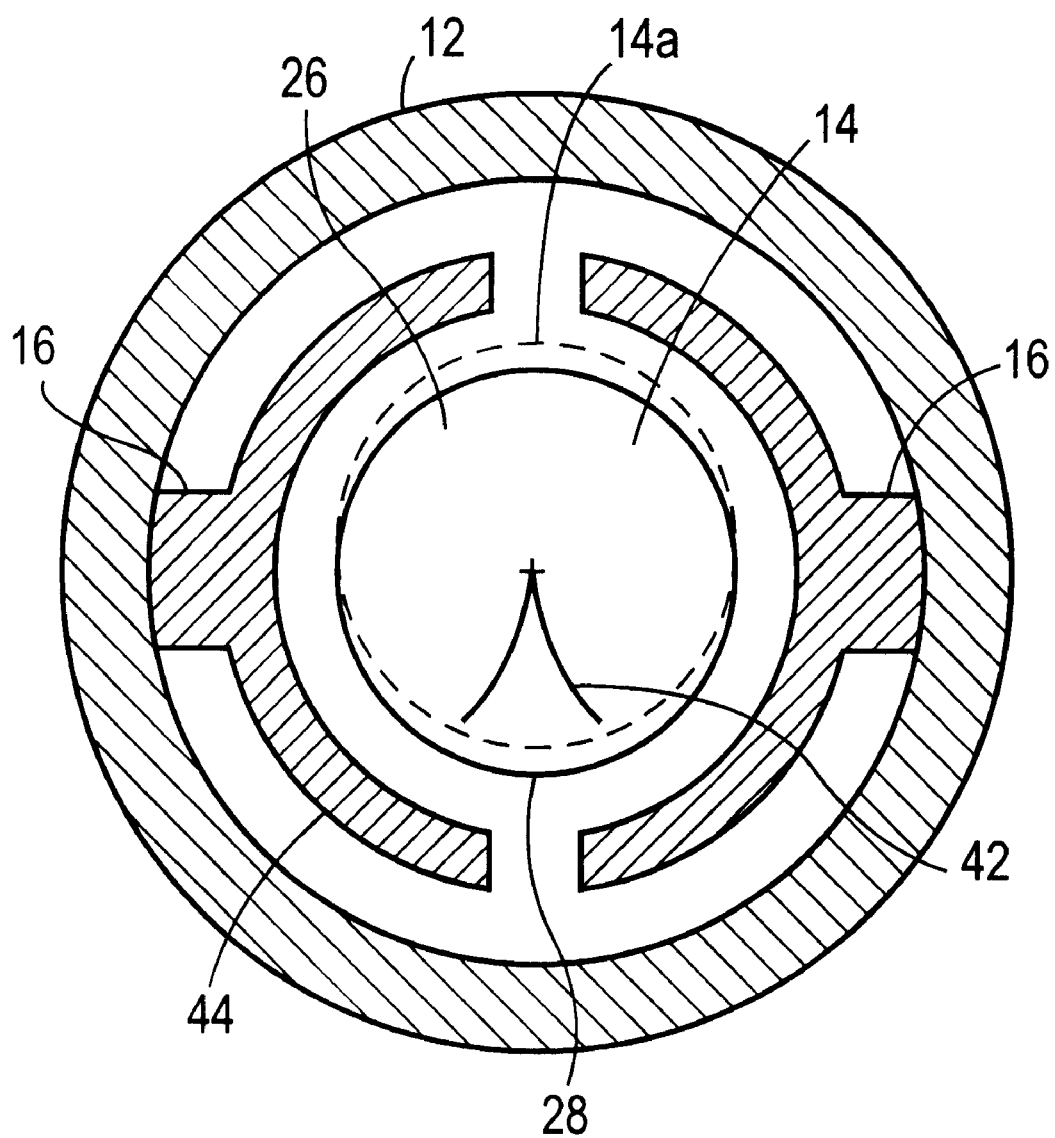
FIG. 2 is a simplified cross section of the motor shown in FIG. 1.
Figure 3:
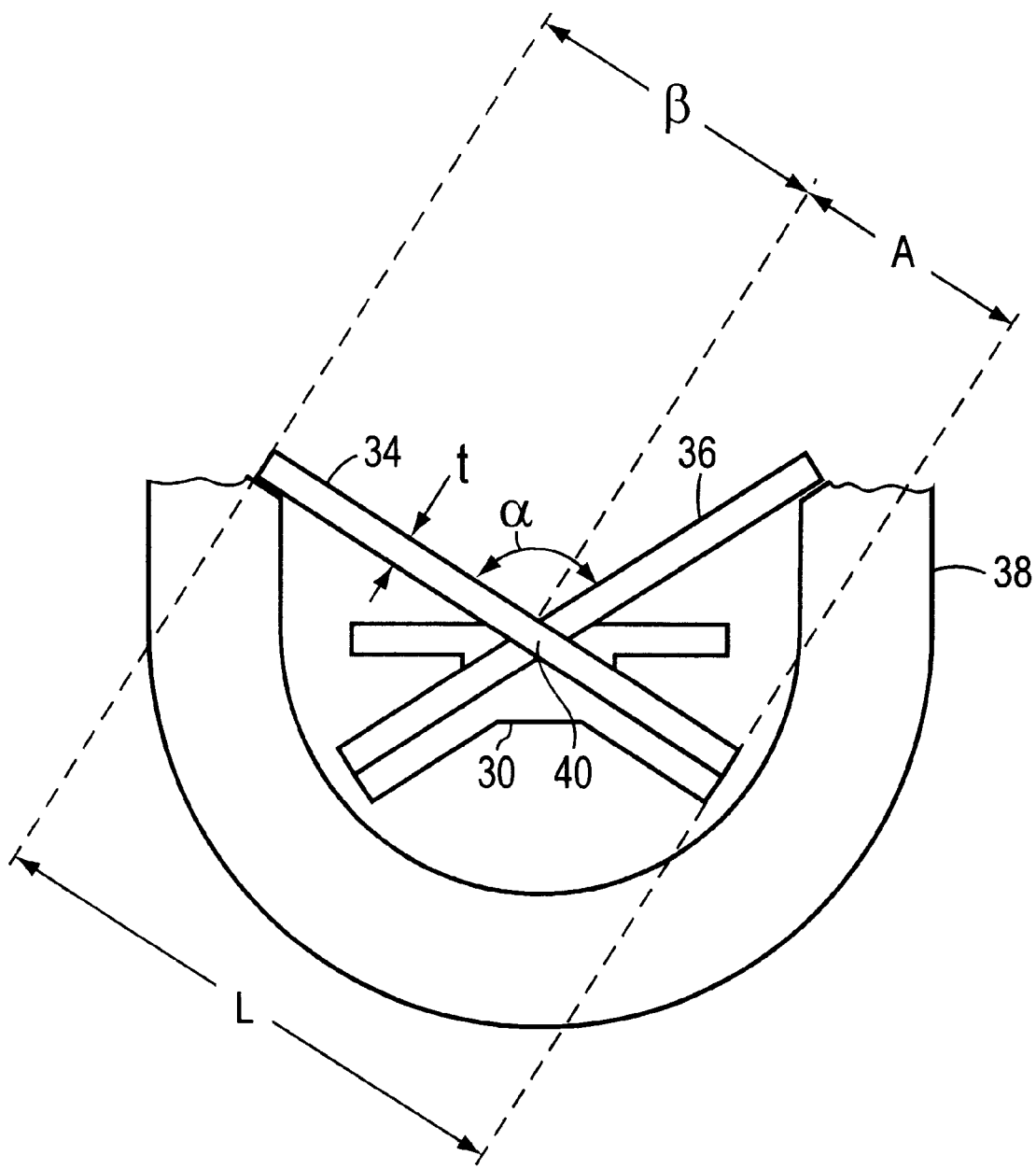
FIG. 3 is an end view of the flexure suspension illustrated in FIG. 1.

Referring to FIGS. 1–3, wherein like numerals reference like or corresponding parts throughout the several views, a crossed-flexure galvanometer assembly is shown generally at 8. The galvanometer assembly has a motor, which is shown generally at 10. The motor includes a stator 12, and an armature in the form of a cylindrical permanent-magnet 14. The stator 12 includes coils (not shown) wound around the necks of semi-cylindrical poles 16 and 18 (FIG. 2). Essentially, the motor assembly is a galvanometer for angularly displacing armature 18 as a function of current flow through the stator coils.

The armature 14 is magnetized to provide radially-facing north and south poles 26, 28. The shaft 30, which is typically used for mounting a mirror or other similar device, (not shown) is suspended by a pair of crossed-flexure springs 34, 36.

Each flexure spring 34, 36 may be thought of as having two length components, a length "A" from a crossover axis 40 to an attachment on the shaft base 38, and the length B from the crossover axis point to an attachment on the base 30. For a given angle of intersection "a", the effect of varying the ratio of the lengths arms A, B from unity is to increase the rotational stiffness of the pivot, and to decrease the displacement of the axis of rotation.

For example, in the case of a 90 degree angle of intersection, and rotation under pure torque, the displacement D of the axis 40 is given by:

$$D = (5-9e^2)/60(R^2 \sec^{a}/2)$$

Where:

e=(A−B)/L;

L is the overall length of each flexure; and

R is the angle of rotation.

The value of D is a minimum for a value of e=0.745, and a maximum for a value of e=0 (A and B equal at ½ L). It is evident from the foregoing that a crossed-flexure pivot galvanometer designer can produce a range of axis displacements, and hence a range of approximate resonant frequencies, as a function of angle of rotation by choice of the ratio of the lengths of the flexure arms A, B.

The rotational stiffness K is given by:

$$K = k(1+3e^2)$$

Where:

k is the elementary stiffness $Ewt^3/12L$;

E is Young's modulus;

w is flexure width; and t is the flexure thickness.

The frequency F, of the fundamental torsional resonance is given by:

$$F = \left(\frac{\pi}{2}\right)\left(\frac{K}{J}\right)^{\frac{1}{2}}$$

Where: J is the moment of inertia of the rotor comprising the armature 14, the shaft 30 and the load.

As the armature 14 is rotated clockwise and counterclockwise within stator 12 it is alternately displaced along paths qualitatively, but not quantitatively shown at 42, 44. (FIG. 2). When the armature 18 is displaced radially from its indicated rest position the radial attractive forces on the armature become unbalanced; specifically they tend to increase the displacement of the magnet 14 in the same direction against the centering torque of the flexure springs 34, 36. The torque produced by this de-centering of the armature 14 is proportional to the square of the axis displacement D.

As a result, the magnetic forces produced by displacement of the magnet 14 as a function of rotational angle R functions as a magnetic spring in opposition to the crossed-flexure springs 34, 36, with the effect that the effective rotational spring constant of the system is reduced, and the first torsional resonance is lowered in frequency compared with an identical galvanometer whose axis displacement is smaller. The resonant frequency of the scanner assembly 8, can be adjusted by moving the stator 12 relative to the armature 18 along a line passing through the poles of the rotor in its rest position, i.e., vertically in FIG. 2. Specifically, if the stator is moved upward, equivalent to moving the armature 18 downward, the downward movement of the armature during rotation will be accentuated, with a resulting decrease in rotational stiffness and corresponding decrease in resonant frequency. Conversely, with downward displacement of the stator 12, corresponding to upward movement of the armature 14, to the dashed line position, the magnetic spring effect will be reduced with a corresponding increase in resonant frequency. In fact, if the stator is displaced sufficiently in the downward direction, the magnetic spring effect will be reversed, i.e. over a range of angular excursions of the armature 14, it will tend to return the armature to the rest position. The overall spring constant will be increased, with a corresponding increase in resonant frequency.

Adjustment of the stator position is accomplished by loosening the bolts 64, 66 and moving the stator in the desired direction, such movement being permitted by the oversize holes 68, 70. When the stator 12 is in the desired position, the bolts are tightened to retain it in that position.

It will be apparent that the stator axis may be stationary and the rotor axis displaced to vary the spring constant. The claims are therefore intended to cover relative displacement of the axis's, however, it is achieved.

It will therefore be seen that we have developed an apparatus and method for precisely tuning the resonant frequency of a galvanometer. The terms and expressions employed herein are used as terms of description and not limitation, and there is no intention, in the use of such terms and expressions, of excluding any equivalents of the features shown and described or portions thereof, but it is recognized that various modifications are possible within the scope of the invention.

What is claimed is:

1. A crossed-flexure-pivot galvanometer having a tunable resonant frequency, said galvanometer comprising:
    (a) a base;
    (b) a plurality of flexures having first and second ends, the first end of each flexure being attached to the base;
    (c) a rotor comprising a permanent-magnet having radially facing magnetic armature poles, a shaft and a load connected to the shaft, the second end of each flexure being attached to the shaft, the flexures suspending the shaft within the base for torsional oscillation therewithin, the plurality of flexures, and the rotor collectively having at least one resonant frequency of torsional oscillation;
    (d) a stator having a center, the stator being adjustably attached to the base; and
    (e) means for adjusting the axis of the stator with respect to the axis of the rotor.

2. The galvanometer of claim 1 wherein the stator includes a bracket portion that is attached to the base.

3. The galvanometer of claim 2 wherein the means for adjusting the axis of the stator with respect to the rotor includes maneuvering the bracket portion of the stator relative to the frame of the galvanometer, thereby controlling the relative position of the rotor within the stator, until a desired resonant frequency of the galvanometer is achieved.

4. The galvanometer of claim 3, further comprising a load attached to the rotor.

5. The galvanometer of claim 4 wherein the load attached to the rotor is a mirror.

* * * * *

UNITED STATES PATENT AND TRADEMARK OFFICE
CERTIFICATE OF CORRECTION

PATENT NO. : 6,265,794 B1  
DATED : July 24, 2001  
INVENTOR(S) : DeBoalt

It is certified that error appears in the above-identified patent and that said Letters Patent is hereby corrected as shown below:

<u>Title page,</u>
Item [73], Assignee, should read -- GSI Lumonics, Inc., Billerica, MA (US) --

Signed and Sealed this

Sixteenth Day of July, 2002

*Attest:*

JAMES E. ROGAN
*Attesting Officer*     *Director of the United States Patent and Trademark Office*